United States Patent
Mylly

(10) Patent No.: US 7,466,588 B2
(45) Date of Patent: Dec. 16, 2008

(54) METHOD FOR IMPROVING PROGRAMMING SPEED IN MEMORY DEVICES

(75) Inventor: Kimmo Mylly, Julkujärvi (FI)

(73) Assignee: Nokia Corporation, Espoo (FI)

( * ) Notice: Subject to any disclaimer, the term of this patent is extended or adjusted under 35 U.S.C. 154(b) by 143 days.

(21) Appl. No.: 10/962,064

(22) Filed: Oct. 7, 2004

(65) Prior Publication Data

US 2006/0077711 A1     Apr. 13, 2006

(51) Int. Cl.
*G11C 11/34* (2006.01)
(52) U.S. Cl. .......................... 365/185.17; 365/185.18; 365/185.11
(58) Field of Classification Search ............ 365/185.17, 365/185.18, 185.11
See application file for complete search history.

(56) References Cited

U.S. PATENT DOCUMENTS

| | | | |
|---|---|---|---|
| 5,414,829 A | 5/1995 | Fandrich et al. ............. | 395/425 |
| 6,128,231 A | 10/2000 | Chung ................... | 365/185.23 |
| 6,256,229 B1 * | 7/2001 | Roohparvar ............ | 365/185.18 |
| 6,288,936 B1 * | 9/2001 | Kawamura ............. | 365/185.03 |
| 6,335,881 B2 | 1/2002 | Kim et al. .............. | 365/185.18 |
| 6,552,933 B2 * | 4/2003 | Roohparvar ........... | 365/185.18 |
| 6,781,881 B2 * | 8/2004 | Chih ..................... | 365/185.18 |
| 7,031,190 B2 * | 4/2006 | Lee ........................ | 365/185.17 |
| 2003/0058692 A1 | 3/2003 | Shiga ......................... | 323/222 |
| 2004/0167653 A1 | 8/2004 | Kaki et al. .................. | 700/103 |

FOREIGN PATENT DOCUMENTS

WO     WO 98/29890     7/1998

* cited by examiner

*Primary Examiner*—Huan Hoang
(74) *Attorney, Agent, or Firm*—Ware, Fressola, Van Der Sluys & Adolphson LLP

(57) ABSTRACT

A high voltage up to 20V is usually applied to a NAND flash memory device for programming or easing a memory section. The programming/easing voltage must reach that high voltage state when the R/B signal is in the L state to start the actual cell programming or erasing. To improve the programming or erasing efficiency, the applied voltage also reaches the high voltage state before the R/B signal is set from H to L. The memory device may have one connecting pad to receive a normal operating voltage and another connection pad to receive the programming and erasing voltage. The EXT_CSD register may have a mode bit to indicate whether the memory device supports the programming and erasing operation.

27 Claims, 8 Drawing Sheets

METHOD FOR IMPROVING PROGRAMMING SPEED IN MEMORY DEVICES

FIELD OF THE INVENTION

The present invention relates generally to a memory device and, more particularly, to the programming of such device.

BACKGROUND OF THE INVENTION

Flash memory is a form of EEPROM (Electronically Erasable Programmable Read Only Memory) that allows multiple memory locations to be erased or written in one programming operation. Flash memory is a transistor technology and is generally classified into NOR flash and NAND flash. The names refer to the gate logic architecture of the memory cells. NOR flash memory has a longer erase and Write times than NAND flash memory, but NOR flash memory has a full address/data interface that allows random access to any location. NOR is suitable for storage of program code that needs to be infrequently updated, as in digital cameras and PDAs.

NAND flash memory has faster erase and write times (per bytes, depending on the access), higher density and lower cost per bit than NOR flash. However, its I/O interface allows only sequential access of data. NAND flash memory is popular with flash memory cards, USB flash drives for data storage and other mass memory devices. Among those flash memory card formats are MultiMediaCard (MMC), Secure Digital (SD), Memory Stick (MS) and xD Picture card.

Although NAND flash memory is faster to write as compared to other flash technologies such as NOR, improvement of the programming performance of NAND flash memory is still desirable. As density requirements in memories are increasing and content pre-programming starts to be more routine, programming performance becomes more critical from cost point of view. In the past, because of power consumption degradation, the power circuitry that is used to provide the programming or erasing voltage (up to 20V in NAND) is driven low after every block (page) access, as shown in FIG. 1. As shown in FIG. 1, the ready/busy signal (R/B) is in the low state after the setup in the I/O is ready. At the same time, the programming voltage Vprg is ramped up from "L" to "H". Only after the Vprg is sufficiently ramped up does the actual cell programming begin. Thus, the total programming time is the sum of the actual cell programming time and the ramping up time. As such, the programming or erasing operation is not highly efficient. In production where a large amount of data is programmed to the card prior to putting it into a sales package, for example, it is advantageous and desirable to provide a method for improving the speed for programming the memory devices.

SUMMARY OF THE INVENTION

In order to improve the programming or erasing efficiency in a memory device, the programming and erasing voltage is ready in the high voltage state before the R/B signal is set from H to L. The programming and erasing voltage can be in the high voltage state in the entire time period when the R/B signal is in the H state, or only in part of that time period. The memory device may have one connecting pad to receive a normal operating voltage and another connection pad to receive the programming and erasing voltage. The EXT_CSD register may have a mode bit to indicate whether the memory device supports the programming and erasing operation.

Thus, the first aspect of the present invention provides a method for improving efficiency in performing a data change in a memory section in a memory device by applying a voltage to the memory device in a time period, the time period comprising a first time segment for data setup and a second time segment following the first time segment, and wherein the applied voltage must reach a predetermined voltage value in the second time segment for effecting the data change. The method comprises: providing the applied voltage to the memory device such that the applied voltage substantially reaches the predetermined voltage value also in at least a part of the first time segment.

According to the present invention, a command signal is provided in the memory device in the first time segment for commanding the data change in the memory section, and wherein the applied voltage reaches the predetermined voltage value in the first time segment before, after or during the command signal is provided.

According to the present invention, the applied voltage reaches the predetermined voltage value in the entire first time segment.

According to the present invention, the data change comprises writing data in a programming operation and removing data in an erasing operation.

According to the present invention, the memory section comprises a page or a block in the memory device.

According to the present invention, the time period is preceded by a preceding time period, the preceding time period also comprising a first time segment and a second time segment and wherein the applied voltage at the second state in the second time segment of the preceding time period is changed to the first state in the first time segment of the time period.

According to the present invention, the time period is followed by a next time period, the next time period also comprising a first time segment and a second time segment and wherein the applied voltage at the second state in the second time segment is maintained in at least a part of the first time segment of the next time period before it is changed to the first state.

According to the present invention, an R/B signal is provided in the memory device and wherein the R/B signal is in an "H" state in the first time segment and the R/B is in an "L" state in the second time segment.

According to the present invention, the memory device comprises a NAND flash memory device and the predetermined voltage value is substantially equal to 20V.

The second aspect of the present invention provides a host device, which comprises:

a voltage source for providing an applied voltage to a memory device in a time period for performing a data change in a memory section of the memory device, the time period comprising a first time segment for data setup and a second time segment following the first time segment, wherein the applied voltage must reach a predetermined voltage value in the second time segment in order to effect the data change; and a control unit, operatively connected to the voltage source, for controlling the applied voltage such that the applied voltage substantially reaches the predetermined voltage value also in at least a part of the first time segment.

According to the present invention, the host device further comprises a signal output for providing a command signal to the memory device in the first time segment for commanding the data change in the memory device, wherein the applied voltage reaches the predetermined voltage value in the first time segment before, after or when the command signal is provided.

According to the present invention, the applied voltage reaches the predetermined voltage value in the entire first time segment.

The third aspect of the present invention provides a system for performing a data change in a memory section in a memory device in a time period. The system comprises:

a host device having a voltage source, a data output and a signal output; and a signal bus comprising a plurality of lines for providing physical connections between the host device and the memory device, the lines comprising a voltage line, a signal line and at least one data line, wherein the memory device comprises:

a voltage connection pad operatively connected to the voltage source via the voltage line to receive an applied voltage from the voltage source;

a signal connector operatively connected to the signal output via the signal line; and at least one data connector operatively connected to the data output via said at least one data line, and wherein the time period comprising a first time segment for data setup in said at least one data line, and a second time segment following the first time segment, and the applied voltage must reach a predetermined voltage value in the second time segment in order to effect the data change; and a controller operatively connected to the voltage source to control the applied voltage such that the applied voltage substantially reaches the predetermined voltage value also in at least a part of the first time segment.

The fourth aspect of the present invention provides a memory device having a plurality of memory sections for storing data. The memory device comprises:

at least one data connector to convey data; and a voltage connector to receive a voltage in association with said data conveying, the voltage having a first voltage setting when data in the memory sections are conveyed to an electronic device, and a second voltage setting in at least a time period for performing a data change in one of said memory sections, wherein the time period comprises a first time segment for data setup and a second time segment following the fist time segment, and wherein the voltage in the second voltage setting must reach a predetermined voltage value in the second time segment for effecting the data change, and the voltage in the second voltage setting substantially reaches the predetermined value also in at least a part of the first time segment.

According to the present invention, the voltage connector comprises a first connector section for receiving the voltage in the first voltage setting and a second connection section for receiving the voltage in the second voltage setting.

According to the present invention, the memory device further comprises a signal connector for receiving a command signal in the first time segment for commanding the data change in the memory section, wherein the voltage in the second voltage setting reaches the predetermined voltage value in the first time segment before, after or when the command signal is received.

According to the present invention, the voltage in the second voltage setting reaches the predetermined voltage value in the entire first time segment.

According to the present invention, the memory device comprises a NAND flash memory device.

According to the present invention, the voltage in the first voltage setting is substantially between 1.5V and 4.0V, and the predetermined voltage value is substantially equal to 20V.

According to the present invention, the memory device further comprises a register to indicate that the memory device supports the second voltage setting for effecting the data change. The support is indicated in at least a data bit in the EXT_CSD register.

The fifth aspect of the present invention provides a software product embedded in a computer readable medium for use with a host device for performing a data change in a memory device by applying a voltage to the memory device in a time period, the time period comprising a first time segment for data setup and a second time segment following the first time segment, wherein the applied voltage must reach a predetermined voltage value in the second time segment for effecting the data change, the memory device comprising:

a plurality of memory sections for storing data;

a data connector to convey data;

a voltage connector to receive a voltage in association with said data conveying, the voltage having a first voltage setting when data in the memory sections are conveyed to an electronic device, a second voltage setting in at least a time period for performing said data change in at least one of said memory sections; and at least a register to indicate that the memory device supports the second voltage setting.

The software product comprises executable codes, which, when executed, carry out:

reading the register for determining whether the memory device supports the second voltage setting; and if so, causing the host device to apply the voltage in the second setting to the memory device for effecting said data change, wherein the voltage in the second voltage setting reaches the predetermined voltage value also in at least a part of the first time segment.

The present invention will become apparent upon reading the description taken in conjunction with FIGS. 2a-7d.

DETAILED DESCRIPTION OF THE INVENTION

Figure 2A:
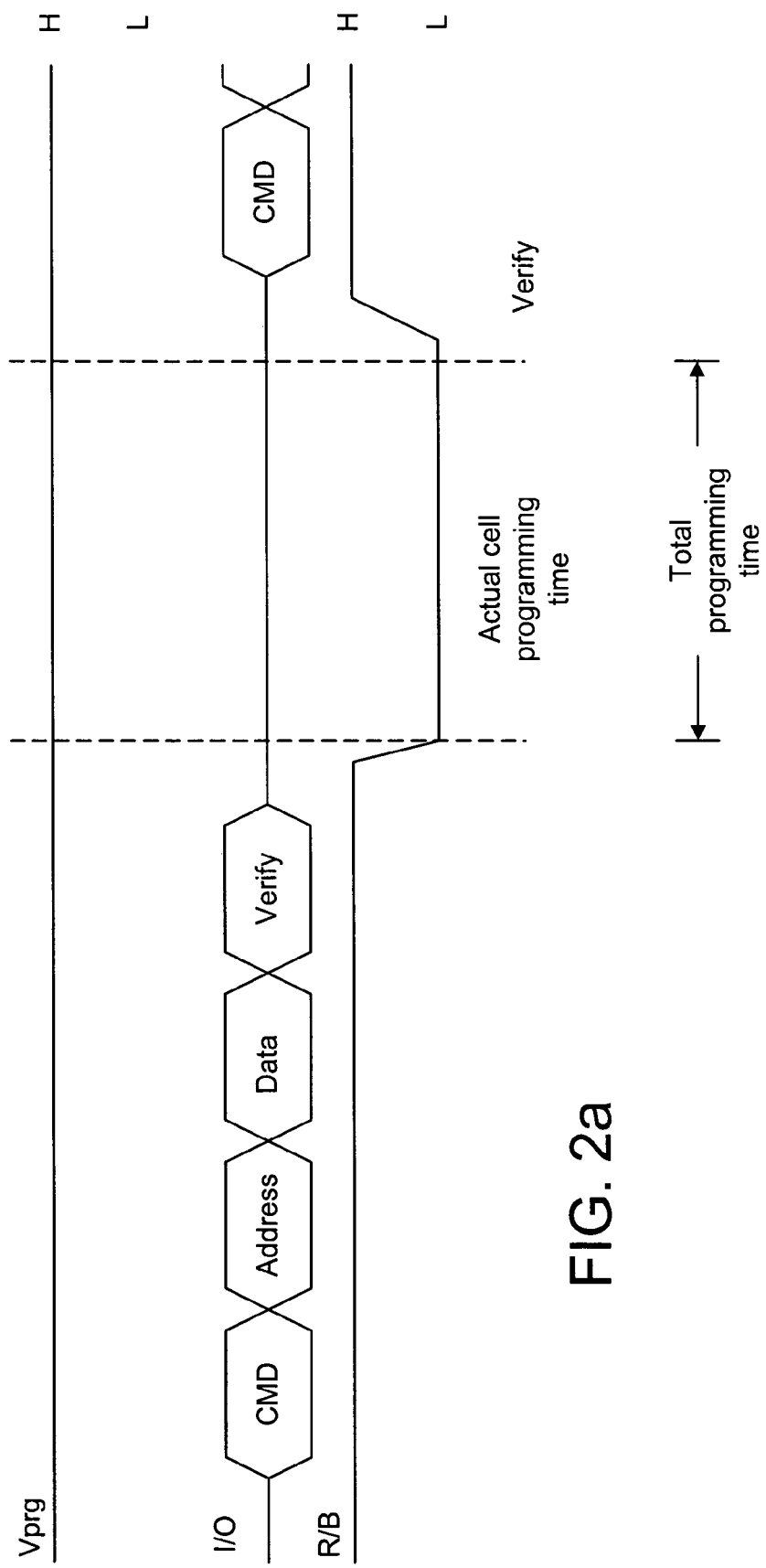
FIG. 2a is a timing chart showing the voltage level used in programming or erasing a NAND flash memory, according to an embodiment of the present invention.

In order to improve the efficiency in programming or erasing a memory device, it is possible to eliminate the ramping up time in the programming/erasing operation. According to the present invention, the programming/erasing voltage, Vprg, can be kept "high" all the time, as shown in FIG. 2a. As such, actual cell programming starts as soon as the R/B signal drops to the low state. As a result, the total programming time is essentially equal to the actual cell programming time.

Figure 2B:
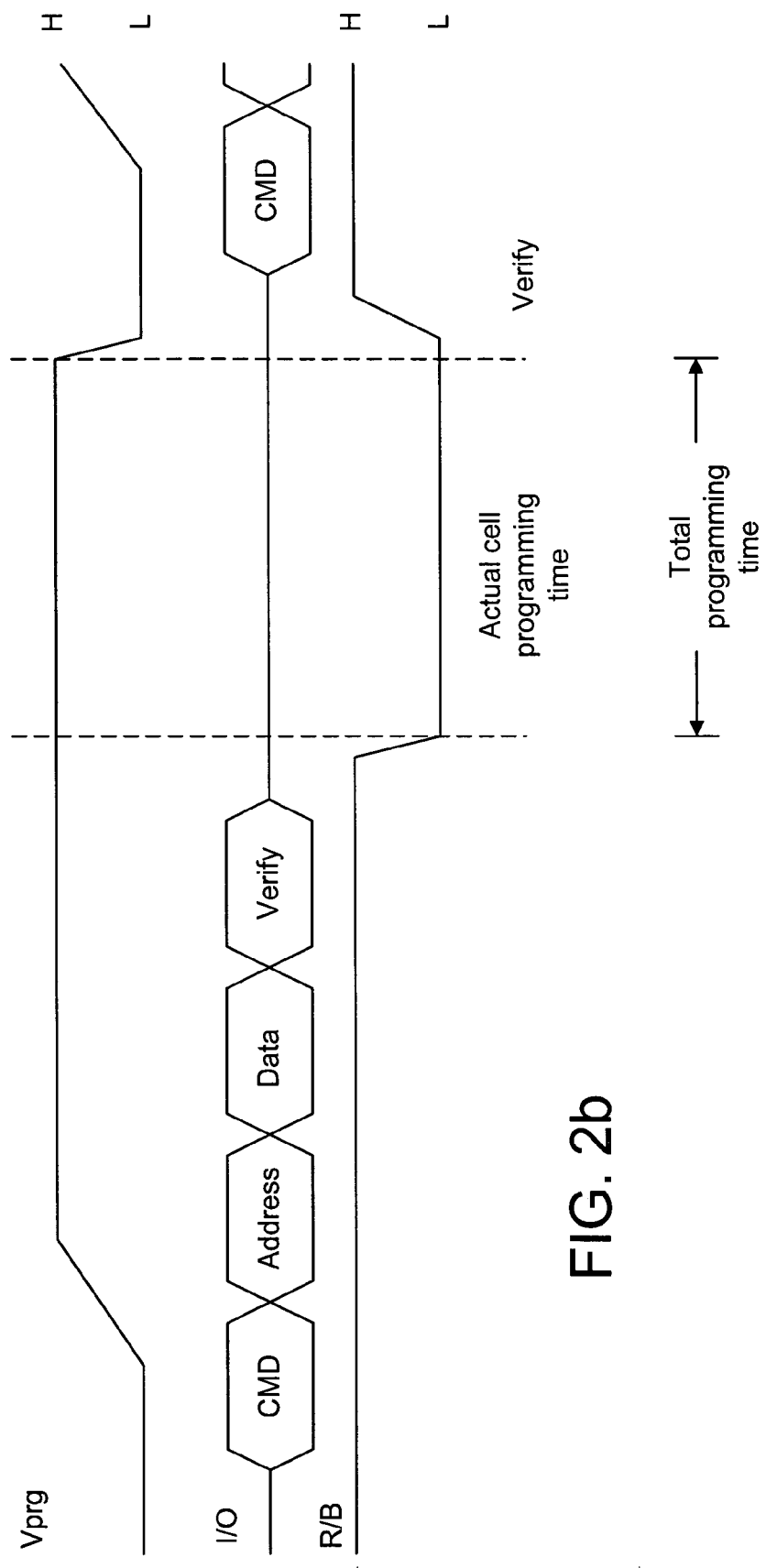
FIG. 2b is a timing chart showing another voltage level used in programming or erasing a NAND flash memory, according to another embodiment of the present invention.

In another embodiment of the present invention, Vprg is ramped up during the I/O setup period. For example, it is possible to start ramping up the programming/erasing voltage Vprg right after the command (CMD) for program/erase is received, as shown in FIG. 2b. Thus, Vprg can be ramped up during the I/O setup period, so long as Vprg becomes "H" before the R/B signal drops to the low state.

Figure 2C:
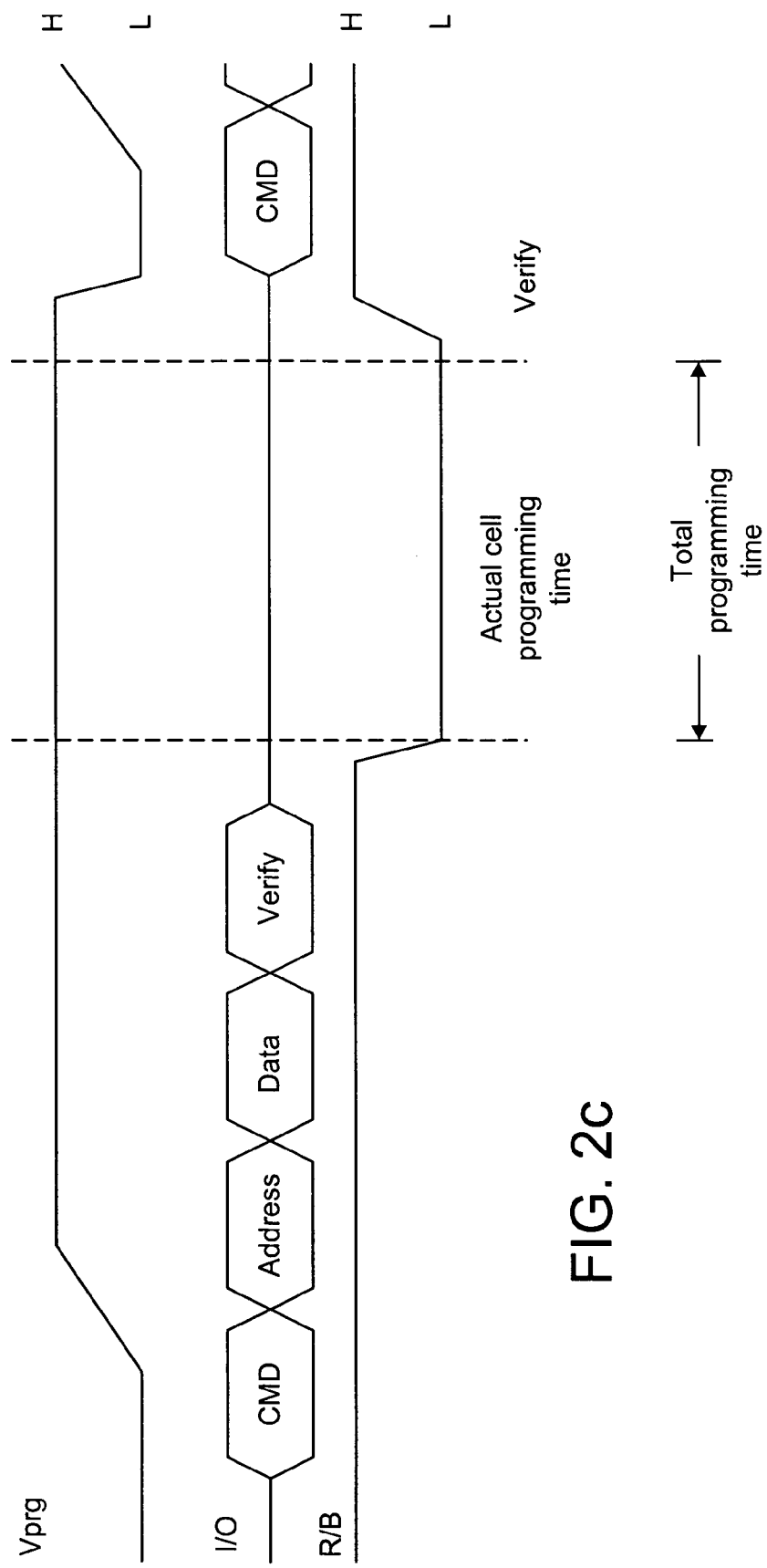
FIG. 2c is a timing chart showing yet another voltage level used in programming or erasing a NAND flash memory, according to yet another embodiment of the present invention.

In yet another embodiment of the present invention, Vprg is ramped up during the I/O setup period to become "H" before the R/B signal drops to the low state, and the Vprg is maintained at the "H" state even after the R/B signal rises to the high state, as shown in FIG. 2c.

Figure 3:
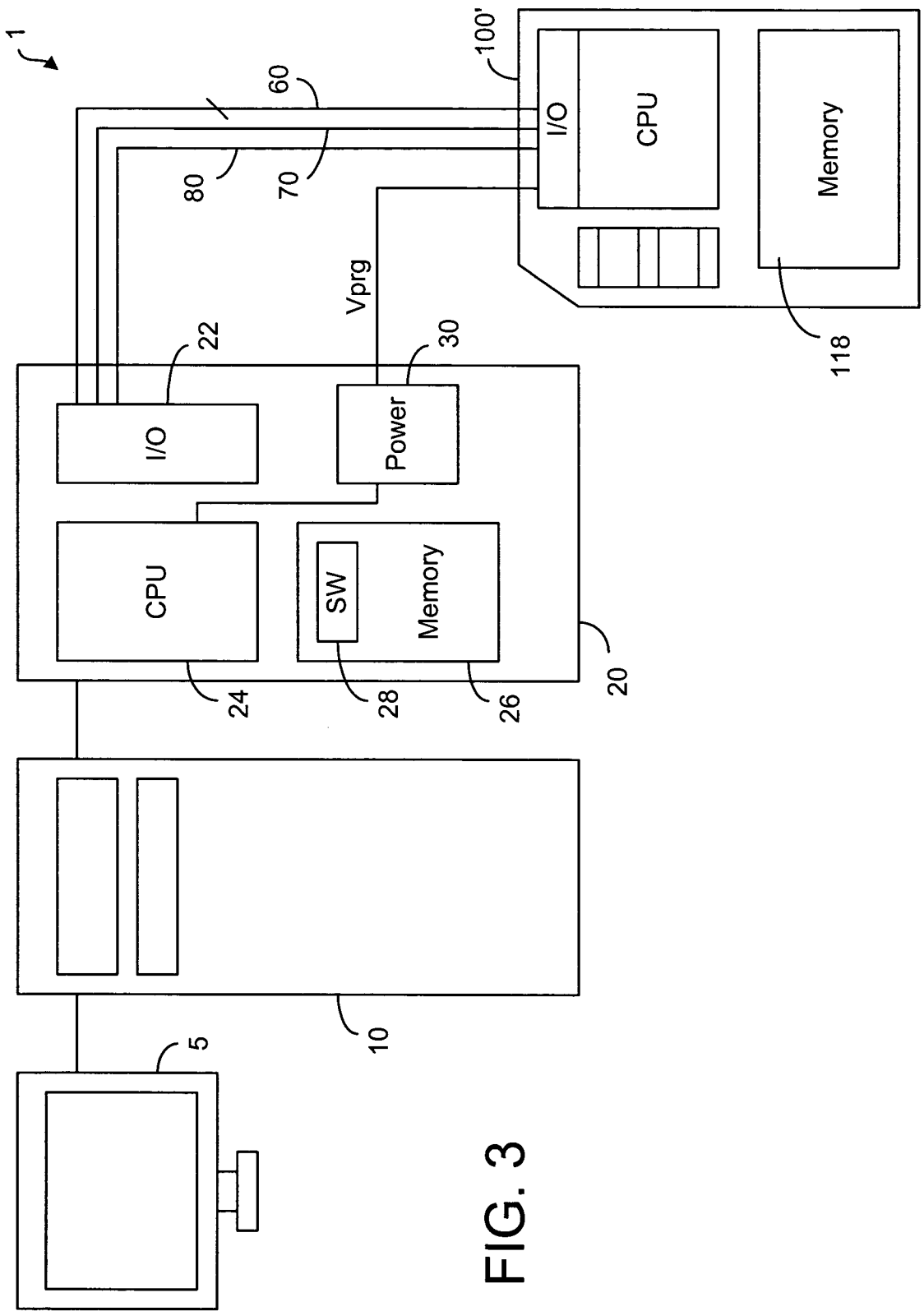
FIG. 3 is a block diagram illustrating a system for programming/erasing a NAND flash memory, according to an embodiment of the present invention.
Figure 4:
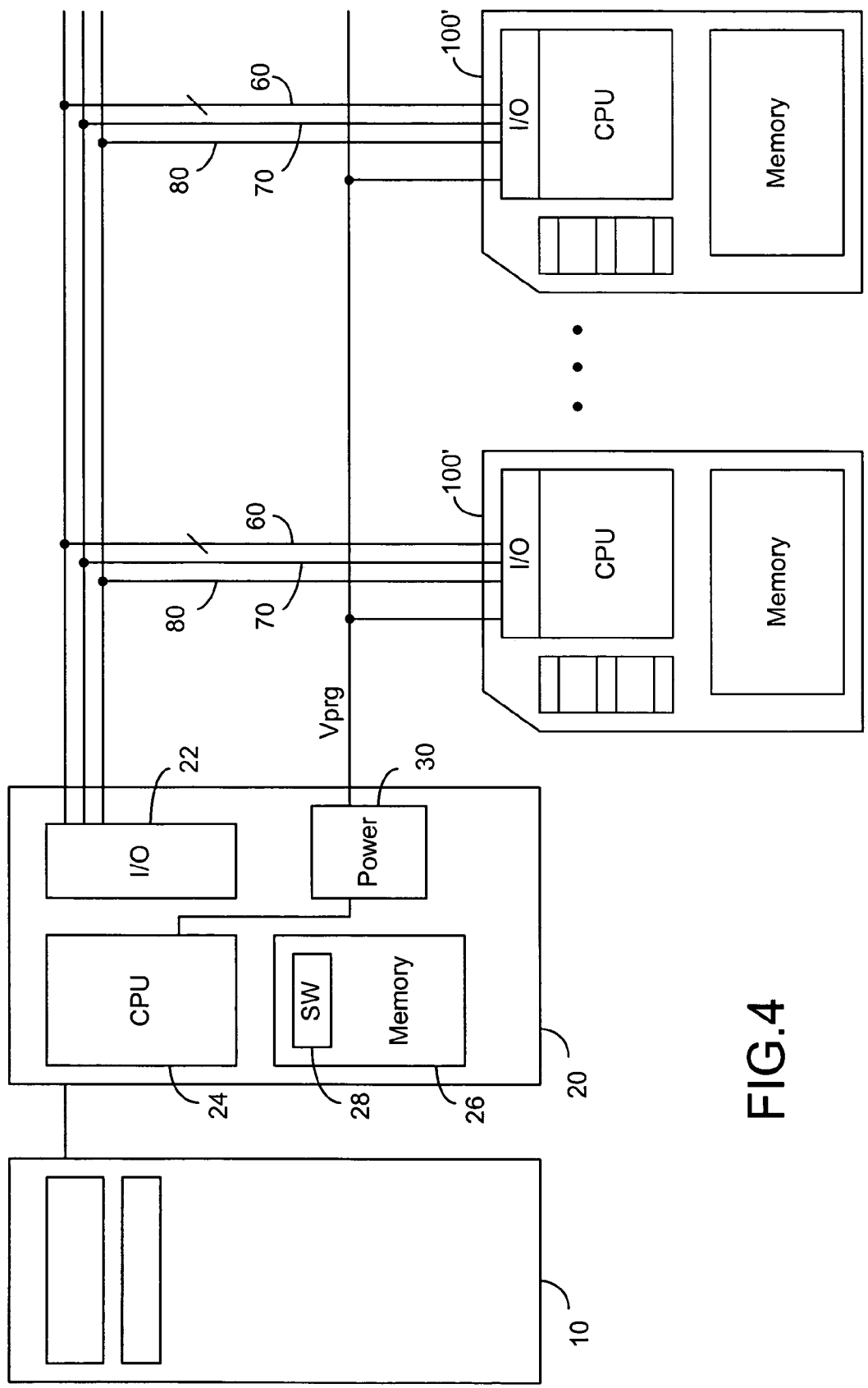
FIG. 4 is a block diagram showing a plurality of memory devices being simultaneously programmed or erased.

FIG. 3 is a block diagram showing a system for programming a memory card. As shown, the system 1 comprises a PC 10, which controls the overall programming system. The PC 10 is operatively connected to a programming device 20 for controlling the programming operations. The programming device 20 comprises an I/O interface 22 operatively connected to a memory card 100' via a data bus 60, a command line (CMD) 70 and a clock line 80. The programming device 20 has a memory unit 26 for storing data to be programmed to the memory device 100' under the control of a CPU 24. The memory unit 26 includes a software program 28 for storing the programming code. The programming device 20 further includes a power supply 30 operatively connected to the memory device 100' for providing the programming voltage Vprg. The CPU 24 is operatively connected to the power supply 30 for controlling the programming voltage Vprg. As shown in FIG. 3, the PC is connected to a display 5 for showing the status of the programming operation. In general, one programming device 20 can be used to simultaneously program or erase a plurality of memory devices 100', as shown in FIG. 4. Although FIGS. 3 and 4 show a system for programming a memory device such as an MMC, a system for programming a NAND device is similar.

Figure 1:
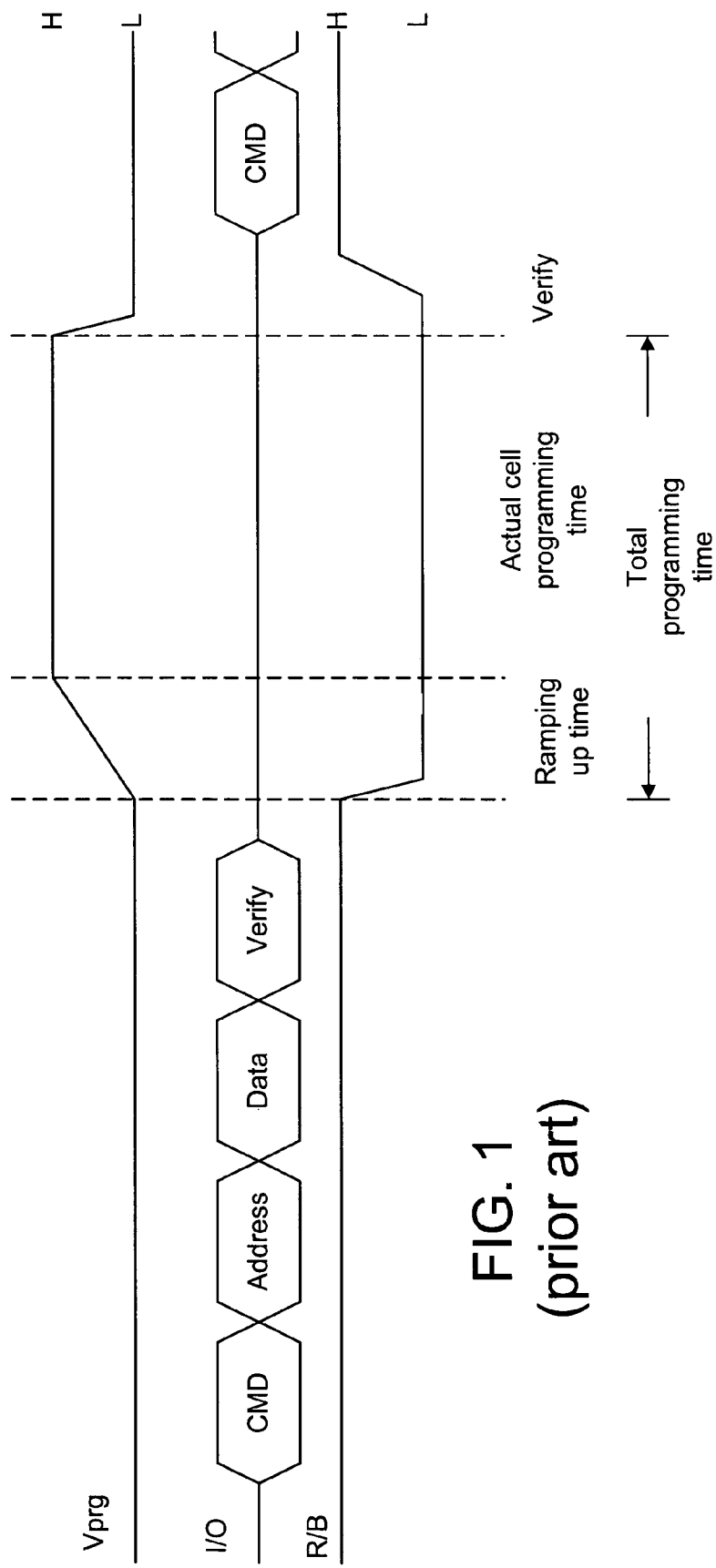
FIG. 1 is a timing chart showing the voltage levels used in programming or erasing a NAND flash memory, according to prior art.

It should be noted that the regular operating voltage Vdd for an MMC or Vcc for a NAND memory device is 1.8V or 3V, whereas the programming/erasing voltage is much higher-up to 20V. Thus, it is possible to have a power circuitry in the memory device such that when the voltage level on Vdd or Vcc is in the normal operating voltage range, then the power circuitry should perform an operation as in prior art, as shown in FIG. 1. But when the power circuitry detects a much higher voltage on Vdd or Vcc, it automatically switches to the efficient programming/erasing mode, according to the present invention. In this efficient mode, the programming/erasing voltage is already at the high level when the I/O setup is ready, as shown in FIGS. 2a and 2b.

Figure 6:
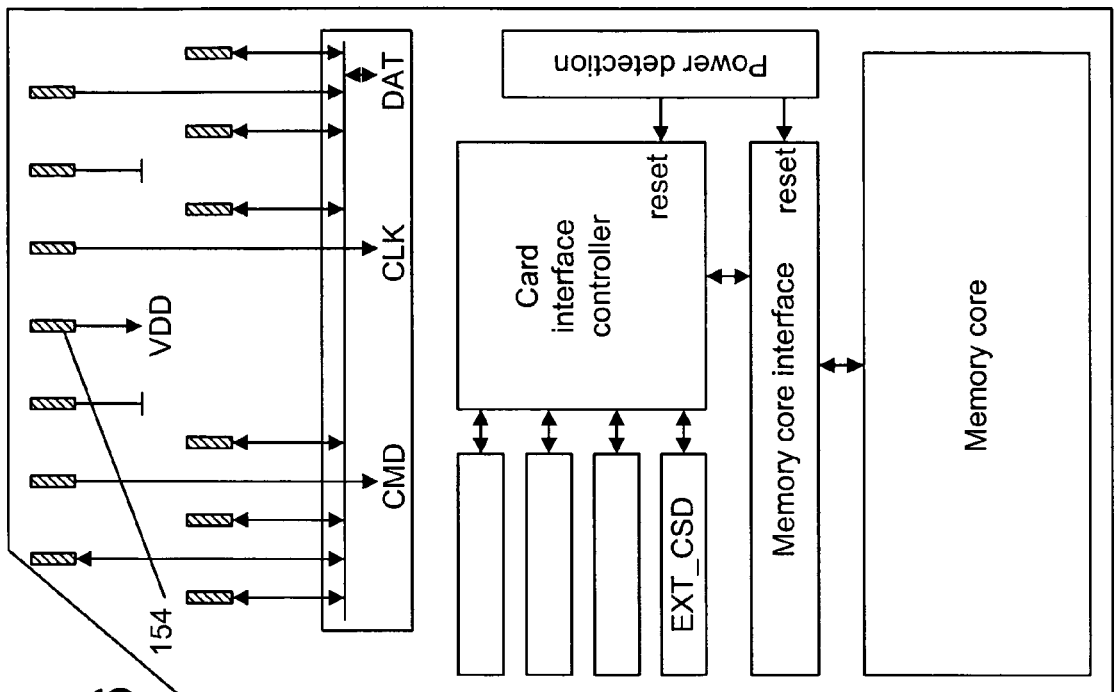
FIG. 6 is a block diagram showing another MMC architecture.
Figure 5:
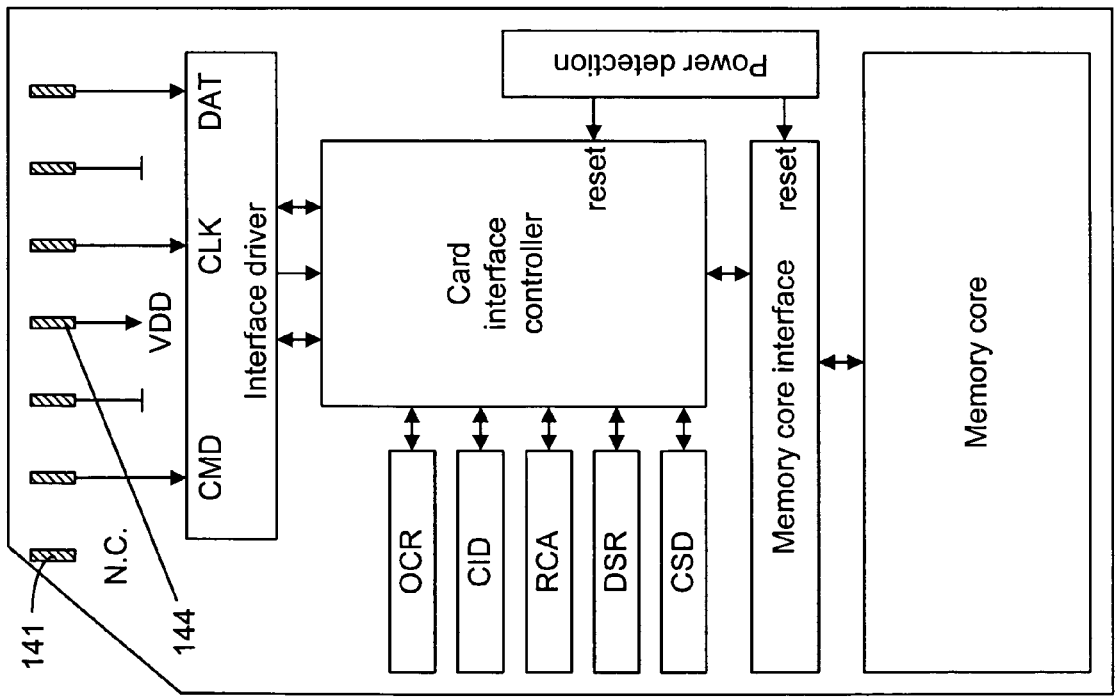
FIG. 5 is a block diagram showing a typical MMC architecture.

In general, a NAND package has many unused (NC) pins. While the Vcc pin on a NAND package is used for normal operating voltage (1.8V, for example), one of the NC pins can be reserved for use in the programming/erasing operation, according to the present invention. On a memory card, there may or may not be an unused pin or pad. An MMC card manufactured in accordance with MultiMediaCard Version 3.31 specification is shown in FIG. 5. An MMC card manufactured in accordance with Version 4.0 specification is shown in FIG. 6. As shown in FIG. 5, the Version 3.31 memory card 100 has a Vdd connecting pad 144 and one unused (N.C.) connecting pad 141. The unused connecting pad 141 can be used for programming and erasing, according to the present invention. As shown in FIG. 6, while the Version 4.0 memory card has a Vdd pin pad 154, it does not have any unused pin pads. In order to perform a high-voltage programming/erasing operation, according to the present invention, it is possible to add a separate pin pad, spaced from other existing pins. Alternatively, it is possible to split the existing pad 154 into two sections as shown in FIGS. 7b-7d.

Figure 7:
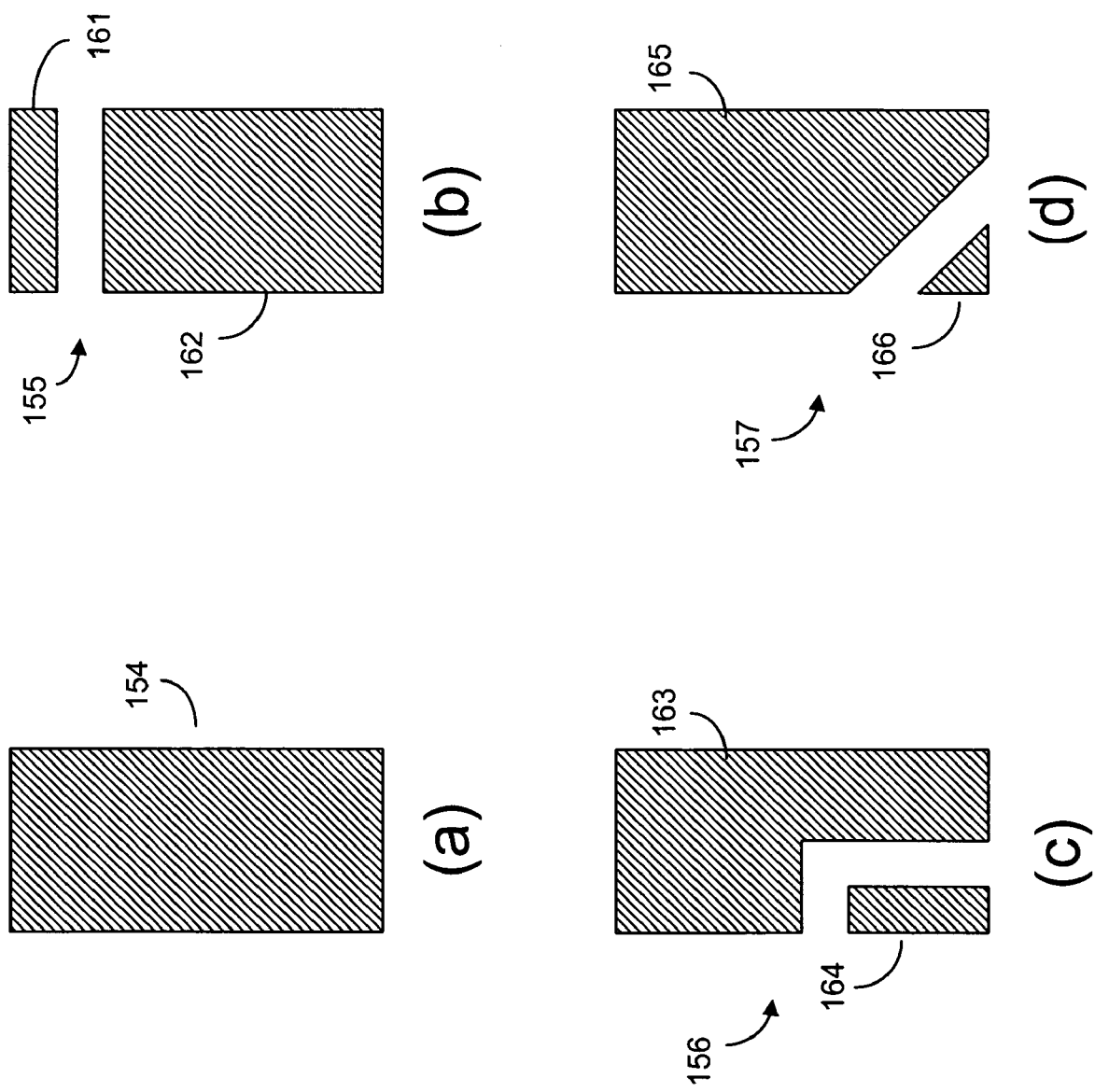
FIG. 7a is a schematic representation showing a regular pin pad for connecting Vdd on a memory card.
FIG. 7b is a schematic representation showing the splitting of a pin pad into two sections.
FIG. 7c is a schematic representation showing another way of splitting a pin pad.
FIG. 7d is a schematic representation showing yet another way of splitting a pin pad.

FIG. 7a shows a regular pad 154. FIG. 7b shows a pad 155 having a first section 161 and a second section 162. While one of the sections is used as a normal Vdd pad to receive a regular operating voltage of 1.8V, for example, the other can be used for high-voltage programming/erasing, according to the present invention. It is also possible to split the pad in different ways. For example, the pad 156 is split into a section 163 and a section 164, as shown in FIG. 7c. Likewise, the pad 157, as shown in FIG. 7d, has a section 165 and a section 166.

In an MMC (Version 4.0 or higher), it is possible to select a mode that accepts the higher voltage for programming/erasing, according to the present invention. For example, it is possible to assign a mode bit in the EXT_CSD (Extended Card Specific Data) register (see FIG. 6) to indicate whether the memory device supports the programming/erasing operation with high voltage Vcc, according to the present invention. The EXT_CSD register contains information about the card capabilities and selected modes as introduced in MMC Specification Version 4. As shown in TABLE I, the properties segment in the EXT_CSD register has a "High voltage input support" property. In the corresponding field, a value of 0x00 in the register High_V means that the operation is not supported (as in legacy cards) and a value of 0x01 indicates that the operation is supported, for example. This properties segment bit could also be used to indicate the support in split pad implementation without the mode segment register.

TABLE I

| Name | Field | Size (Bytes) | Cell Type | CSD-slice |
|---|---|---|---|---|
| Properties segment | | | | |
| Reserved | | 7 | | [511:505] |
| Supported Command Sets | S_CMD_SET | 1 | R | [504] |
| Reserved | | 300 | | [503:204] |
| Power Class for 26 MHz @ 3.6 V | PWR_CL_26_360 | 1 | R | [203] |
| Power Class for 52 MHz @ 3.6 V | PWR_CL_52_360 | 1 | R | [202] |
| Power Class for 26 MHz @ 1.95 V | PWR_CL_26_195 | 1 | R | [201] |
| Power Class for 52 MHz @ 1.95 V | PWR_CL_52_195 | 1 | R | [200] |
| High voltage input support | High_V | 1 | R | [205] |

In the modes segment of the EXT_CSD register, a writing to the register sets the modes of the memory device. As shown in TABLE II, the EXT_CSD register modes segment has a mode High Voltage Mode, with a corresponding field of High_Voltage. A writing of a 0x01 to High_Voltage would enable the programming voltage function, according to the present invention, while a writing of a 0x00 would disable it. Default value after power up should be 0x00 and the register can also be read to check the current value. The mode segment register could also be combined with the split pad implementation.

TABLE II

| Name | Field | Size (Bytes) | Cell Type | CSD-slice |
|---|---|---|---|---|
| Modes segment | | | | |
| Command Set | CMD_SET | 1 | R/W | [191] |
| Reserved | | 1 | | [190] |
| Command Set Revision | CMD_SET_REV | 1 | RO | [189] |
| Reserved | | 1 | | [188] |
| Power Class | POWER_CLASS | 1 | R/W | [187] |
| Reserved | | 1 | | [186] |
| High Speed Interface Timing | HS_TIMING | 1 | R/W | [185] |
| Reserved | | 1 | | [184] |
| Bus Width Mode | BUS_WIDTH | 1 | WO | [183] |
| Reserved | | 183 | | [182:0] |
| High Voltage Mode | High_Voltage | 1 | R/W | [181] |

In sum, the present invention provides a method for improving the efficiency in programming and erasing a memory device by eliminating the ramping up time for the programming voltage Vprg. Thus, the programming voltage Vprg has an H state and an L state according to some embodiments of the present invention. The H state is reached before the R/B signal is set from H to L. Alternatively, Vprg remains in the H state during the programming or erasing operation. Vprg is zero or equal to a low voltage when it is in the L state and is up to 20V in the H state. In a programming operation, the programming time per page is shorter than the prior art method. In an erasing operation, the erasing time per block is shorter. There is no need to increase the clock frequencies to improve the performance. Furthermore, with the present invention, it is still possible to preserve the prior art standard low power usage model for low power applications.

Although the invention has been described with respect to one or more embodiments thereof, it will be understood by those skilled in the art that the foregoing and various other changes, omissions and deviations in the form and detail thereof may be made without departing from the scope of this invention.

What is claimed is:

1. A method for improving efficiency in performing a data change in a memory section in a memory device by applying a voltage to the memory device in a time period, the time period comprising a first time segment for data setup and a second time segment following the first time segment, and wherein the applied voltage must reach a predetermined voltage value in the second time segment for effecting the data change, said method comprising:
providing the applied voltage to the memory device such that the applied voltage substantially reaches the predetermined voltage value also in at least a part of the first time segment, wherein a command signal is provided in the memory device in the first time segment for commanding the data change in the memory section, and wherein the applied voltage always reaches the predetermined voltage value in the first time segment after the command signal is provided.

2. The method of claim 1, wherein the applied voltage reaches the predetermined voltage value in the entire first time segment, after the command signal is provided.

3. The method of claim 1, wherein the data change comprises writing data in a programming operation.

4. The method of claim 3, wherein the memory section comprises a page in the memory device.

5. The method of claim 3, wherein the memory section comprises a block in the memory device.

6. The method of claim 1, wherein the data change comprises removing data in an erasing operation.

7. The method of claim 6, wherein the memory section comprises a block of the memory device.

8. The method of claim 1, wherein the applied voltage comprises a first state and a second state, wherein
when the applied voltage is in the second state, the applied voltage substantially reaches the predetermined voltage value, and
when the applied voltage is in the first state, the applied voltage has a voltage value smaller than the predetermined voltage value.

9. The method of claim 8, wherein the voltage value in the first state is zero.

10. The method of claim 8, wherein the time period is preceded by a preceding time period, the preceding time period also comprising a first time segment and a second time segment and wherein the applied voltage at the second state in the second time segment of the preceding time period is changed to the first state in the first time segment of the time period.

11. The method of claim 8, wherein the time period is followed by a next time period, the next time period also comprising a first time segment and a second time segment and wherein the applied voltage at the second state in the second time segment is maintained in at least a part of the first time segment of the next time period before it is changed to the first state.

12. The method of claim 1, wherein a ready/busy signal (R/B) is provided in the memory device and wherein the ready/busy signal is in an "H" state in the first time segment and the ready/busy is in an "L" state in the second time segment.

13. The method of claim 1, wherein the memory device comprises a NAND flash memory device.

14. The method of claim 13, wherein the predetermined voltage value is substantially equal to 20V.

15. A host device comprising:
a voltage source for providing an applied voltage to a memory device in a time period for performing a data change in a memory section of the memory device, the time period comprising a first time segment for data setup and a second time segment following the first time segment, wherein the applied voltage must reach a predetermined voltage value in the second time segment in order to effect the data change; and
a control unit, operatively connected to the voltage source, for controlling the applied voltage such that the applied voltage substantially reaches the predetermined voltage value also in at least a part of the first time segment, said host device further comprising:
a signal output for providing a command signal to the memory device in the first time segment for commanding the data change in the memory device, wherein the applied voltage always reaches the predetermined voltage value in the first time segment after the command signal is provided.

16. The host device of claim 15, wherein the applied voltage reaches the predetermined voltage value in the entire first time segment.

17. A system for performing a data change in a memory section in a memory device in a time period, said system comprising:

a host device having a voltage source, a data output and a signal output; and a signal bus comprising a plurality of lines for providing physical connections between the host device and the memory device, the lines comprising a voltage line, a signal line and at least one data line, wherein the memory device comprises:

a voltage connection pad operatively connected to the voltage source via the voltage line to receive an applied voltage from the voltage source;

a signal connector operatively connected to the signal output via the signal line; and at least one data connector operatively connected to the data output via said at least one data line, and wherein the time period comprising a first time segment for data setup in said at least one data line, and a second time segment following the first time segment, and the applied voltage must reach a predetermined voltage value in the second time segment in order to effect the data change, wherein a command signal is provided in the memory device in the first time segment for commanding the data change in the memory section; and a controller operatively connected to the voltage source to control the applied voltage such that the applied voltage always reaches the predetermined voltage value also in at least a part of the first time segment after the command signal is provided.

18. A memory device having a plurality of memory sections for storing data, comprising:

at least one data connector to convey data; and a voltage connector to receive a voltage in association with said data conveying, the voltage having a first voltage setting when data in the memory sections are conveyed to an electronic device, and a second voltage setting in at least a time period for performing a data change in one of said memory sections, wherein the time period comprises a first time segment for data setup and a second time segment following the fist time segment, and wherein the voltage in the second voltage setting must reach a predetermined voltage value in the second time segment for effecting the data change, and the voltage in the second voltage setting substantially reaches the predetermined value also in at least a part of the first time segment, wherein a command signal is provided in the memory device in the first time segment for commanding the data change in the memory section, and wherein the applied voltage always reaches the predetermined voltage value in the first time segment after the command signal is provided.

19. The memory device of claim 18, wherein the voltage connector comprises a first connector section for receiving the voltage in the first voltage setting and a second connection section for receiving the voltage in the second voltage setting.

20. The memory device of claim 18, further comprising a signal connector for receiving a command signal in the first time segment for commanding the data change in the memory section, wherein the voltage in the second voltage setting reaches the predetermined voltage value in the first time segment after the command signal is received.

21. The memory device of claim 18, wherein the voltage in the second voltage setting reaches the predetermined voltage value in the entire first time segment.

22. The memory device of claim 18, comprises a NAND flash memory device.

23. The memory device of claim 18, wherein the voltage in the first voltage setting is substantially between 1.5V and 4.0V, and the predetermined voltage value is substantially equal to 20V.

24. The memory device of claim 18, further comprising a register to indicate that the memory device supports the second voltage setting for effecting the data change.

25. The memory device of claim 24, wherein the register has at least a data bit for said indicating.

26. The memory device of claim 24, wherein the register comprises an EXT_CSD (Extended Card Specific Data) register.

27. A computer readable medium embedded with a software program for use with a host device for performing a data change in a memory device, the memory device adapted for receiving an applied voltage in a time period, the time period comprising a first time segment for data setup and a second time segment following the first time segment, wherein the applied voltage must reach a predetermined voltage value in the second time segment for effecting the data change, said software program comprising programming codes for providing a command signal in the first time segment for commanding the data change; and causing the host device to provide the applied voltage to the memory device for effecting said data change, wherein the applied voltage always reaches the predetermined voltage value also in at least a part of the first time segment after the command signal is provided.

* * * * *

UNITED STATES PATENT AND TRADEMARK OFFICE
CERTIFICATE OF CORRECTION

PATENT NO. : 7,466,588 B2  Page 1 of 1
APPLICATION NO. : 10/962064
DATED : December 16, 2008
INVENTOR(S) : K. Mylly It is certified that error appears in the above-identified patent and that said Letters Patent is hereby corrected as shown below:

In Column 9, line 39, claim 18, line 12, "fist" should be --first--.

Signed and Sealed this

Tenth Day of March, 2009

JOHN DOLL
*Acting Director of the United States Patent and Trademark Office*